US010433431B2

(12) United States Patent
Bartley et al.

(10) Patent No.: US 10,433,431 B2
(45) Date of Patent: Oct. 1, 2019

(54) IMPLEMENTING CUSTOMIZED PCB VIA CREATION THROUGH USE OF MAGNETIC PADS

(71) Applicant: International Business Machines Corporation, Armonk, NY (US)

(72) Inventors: Gerald K. Bartley, Rochester, MN (US); Darryl J. Becker, Rochester, MN (US); Matthew S. Doyle, Chatfield, MN (US); Mark J. Jeanson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/391,509

(22) Filed: Apr. 23, 2019

(65) Prior Publication Data

US 2019/0254176 A1    Aug. 15, 2019

Related U.S. Application Data

(62) Division of application No. 15/662,959, filed on Jul. 28, 2017.

(51) Int. Cl.
| | | |
|---|---|---|
| *H05K 1/11* | (2006.01) | |
| *H05K 3/40* | (2006.01) | |
| *H05K 3/32* | (2006.01) | |
| *H05K 3/12* | (2006.01) | |
| *H05K 3/42* | (2006.01) | |

(52) U.S. Cl.
CPC ........... *H05K 3/4046* (2013.01); *H05K 1/113* (2013.01); *H05K 3/1266* (2013.01); *H05K 3/323* (2013.01); *H05K 3/425* (2013.01); *H05K 3/429* (2013.01); *H05K 2201/083* (2013.01); *H05K 2203/0713* (2013.01); *H05K 2203/104* (2013.01)

(58) Field of Classification Search
CPC .... H05K 3/4046; H05K 1/113; H05K 3/1266; H05K 3/323; H05K 3/425; H05K 3/429; H05K 1/11
USPC .......................................................... 361/760
See application file for complete search history.

(56) References Cited

U.S. PATENT DOCUMENTS

| | | |
|---|---|---|
| 5,266,446 A | 11/1993 | Chang et al. |
| 5,763,058 A | 6/1998 | Isen et al. |
| 5,805,392 A | 9/1998 | Mallary et al. |
| 6,091,310 A | 7/2000 | Utsumi et al. |
| 8,262,894 B2 | 9/2012 | Xu et al. |
| 2005/0277339 A1 | 12/2005 | Caveney et al. |
| 2010/0171577 A1 | 7/2010 | Christenson |
| 2011/0042223 A1 | 2/2011 | Kruglick |

OTHER PUBLICATIONS

S. Palacin et al., "Patterning with magnetic materials at the micron scale," Chemistry of Materials, vol. 8, No. 6, 1996, pp. 1316-1325.

(Continued)

*Primary Examiner* — Tremesha S Willis
(74) *Attorney, Agent, or Firm* — Joan Pennington

(57) ABSTRACT

A method and apparatus for implementing customized printed circuit board (PCB) via creation through use of magnetic capture pads. At least one magnetic capture pad is rendered before aqueous seed and plate processing in the PCB manufacture. The magnetic capture pad selectively provides seed material rendering copper in at least one selected region of the via.

13 Claims, 5 Drawing Sheets

(56) References Cited

OTHER PUBLICATIONS

E. Akbarnejad et al., "Chromium thin film deposition on ITO substrate by RF sputtering," Journal of Theoretical and Applied Physics, vol. 8, No. 3, 2014, 6 pages.
Microchemicals GmbH, "Electroplating with Photoresist Masks", pp. 1-6, Jan. 17, 2014 www.microchemicals.com/downloads/application_notes.html.

IMPLEMENTING CUSTOMIZED PCB VIA CREATION THROUGH USE OF MAGNETIC PADS

This is a divisional application of Ser. No. 15/662,959 filed Jul. 28, 2017.

FIELD OF THE INVENTION

The present invention relates generally to the data processing field, and more particularly, relates to a method and apparatus for implementing customized printed circuit board (PCB) via creation through use of magnetic pads.

DESCRIPTION OF THE RELATED ART

In today's complex high speed card and board designs; the electrical characteristics necessary for high speed interfaces do not tolerate the typical electrical stub associated with through vias. These via stubs or remnants of the via not directly carrying through signals create discontinuities which can significantly degrade communications.

To combat this loss, designers require the removal of extraneous stubs typically through post card manufacturing mechanical drilling or chemical etching. Further, the mechanical processes are still prone to imperfections, remnants of metal not fully removed, drill wander, and stress induced defects.

While there are known processes to mechanically remove these stubs, once back-drilled, it is no longer possible to probe those locations on the printed circuit board (PCB), cost of the PCB increases substantially, and success of the process is statistically less than ideal. These facts significantly complicate our ability to manufacture cost-effective PCBs, measure high-speed interfaces in the lab during system bring-up and model-to-hardware correlation activities, and maximize the electrical performance of our computer interfaces. When system errors occur in the field, the field engineer cannot measure and confirm function at these PCB via locations while at the customer's site.

A need exists for a method and apparatus for implementing customized printed circuit board (PCB) via creation through use of magnetic pads, eliminating the need to back-drill, reducing PCB cost, and maximizing interface margin.

As used in the following description and claims, the term printed circuit board (PCB) should be understood to broadly include a printed wiring board or other substrate, an interconnect substrate, and various substrates including a plurality of insulator layers, and internal conductive traces.

SUMMARY OF THE INVENTION

Principal aspects of the present invention are to provide a method and apparatus for implementing customized printed circuit board (PCB) via creation through use of magnetic pads, eliminating post-card manufacturing processes. Other important aspects of the present invention are to provide such method and apparatus substantially without negative effects and that overcome many of the disadvantages of prior art arrangements.

In brief, a method and apparatus for implementing customized printed circuit board (PCB) via creation through use of magnetic pads. At least one magnetic pad is rendered within the via before aqueous seed and plate processing in the PCB manufacture. The magnetic pad enable selectively rendering copper in at least one selected region of the via.

In accordance with features of the invention, the magnetic pads are rendered by an inner-layer PCB or flex processing step and can be accomplished using conventional PCB manufacture methods.

In accordance with features of the invention, the magnetic pads optionally hold ferrous seed material. The ferrous seed material prohibits the seed layer from forming in the via barrel outside of intended area with the seed material being captive by the aqueous magnetic material, and is not be present in substantial quantity outside of these specialized magnetic pad regions. As a result, the plating process renders copper only in the region captive by the magnetic capture pads.

In accordance with features of the invention, the magnetic pad optionally is a magnetic anti-pad holding ferrous resist material. The magnetic pad ferrous resist material prohibits the seed layer from forming in the via barrel outside the intended area of the magnetic anti-pad.

In accordance with features of the invention, the methods of the invention eliminate post-card manufacturing processes and allows the card to be built as required without the issues and steps associated with mechanical/chemical steps.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus for implementing customized printed circuit board (PCB) via creation through use of magnetic pads. At least one magnetic pad is rendered within the via before aqueous seed and plate processing in the PCB manufacture. The magnetic pad enables selectively rendering copper substantially only in a selected region of the via.

Figure 1A:
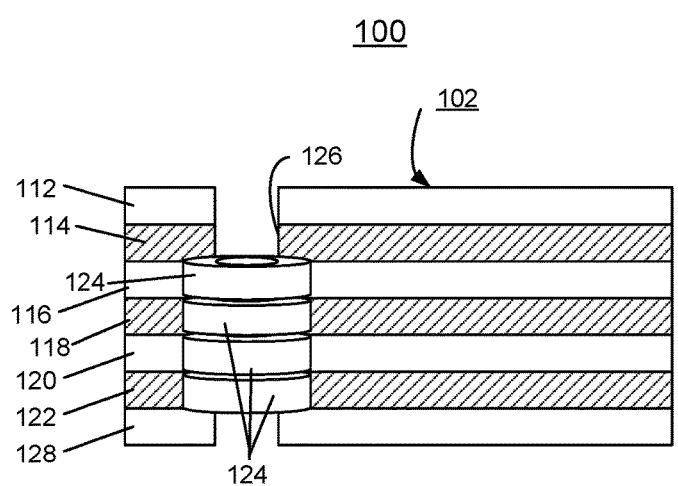
FIGS. 1A and 1B illustrates example structures for manufacturing a printed circuit board (PCB) with enhanced via creation in accordance with a preferred embodiment.
Figure 1B:
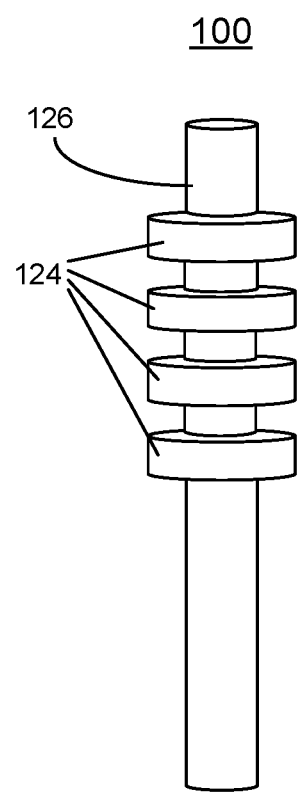

Having reference now to the drawings, in FIGS. 1A and 1B, there is shown example structures generally designated by reference character 100 for manufacturing a printed circuit board (PCB) with enhanced via creation in accordance with the preferred embodiment.

Figure 2A:
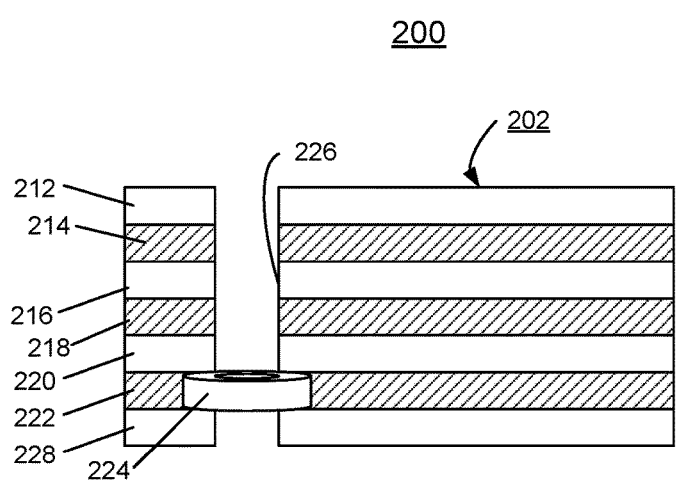
FIGS. 2A and 2B illustrates other example structures for manufacturing a printed circuit board (PCB) with enhanced via creation in accordance with a preferred embodiment.
Figure 2B:
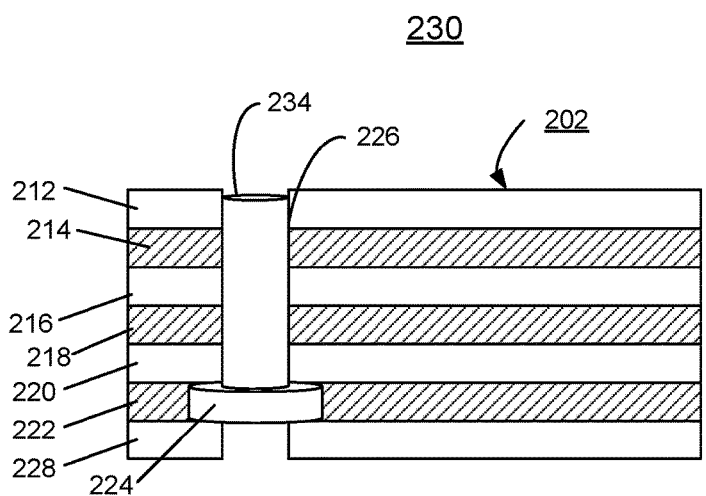

In accordance with features of the invention, magnetic pads 124 of FIGS. 1A and 1B and magnetic pads 224 of FIGS. 2A and 2B are rendered by an inner-layer PCB or flex processing step and can be accomplished using one of several existing PCB manufacture methods.

Structure 100 includes a printed circuit board (PCB) 102 including a plurality of layers 112, 114, 116, 118, 120, 122, and 128, as shown. PCB includes a plurality of magnetic pads 124 rendered within a via 126. PCB 102 includes, for example, a plurality of insulator layers 112, 116, 120, 128 with a plurality of conductive layers 114, 118, 122.

In accordance with features of the invention, the printed circuit board (PCB) 102 and via 126 are formed generally including conventional PCB manufacturing processes, including via drilling.

Structure 100 includes a plurality of magnetic pads 124 rendered within via 126 and the PCB 102 before aqueous seed and plate processing in the PCB manufacture. Magnetic pads 124 advantageously eliminate via barrel stub creation during PCB plating processes during PCB manufacturing.

The magnetic pads 124 hold ferrous seed material. The ferrous seed material prohibits the seed layer from forming in the via barrel outside of intended area with the seed material being captive by the aqueous magnetic material, and is not be present in substantial quantity outside of these specialized capture pad regions. As a result, the plating process renders copper only in the region captive by the magnetic pads. The magnetic pads 124 present an inexpensive and quick method of improving signal performance OF the PCB 102 while also reducing the amount of electroplating required.

An effective adhesion promoter for magnetic pads 124 is a thin titanium film, and for example, chromium is also be very beneficial on the seed layer. If required, this additional adhesion film can be removed after development of the resist where the structures are cleared. In this case, care must be taken not to under-etch the metallic adhesion layer under the resist film. Therefore, the etching step should not take much longer than required for removing the uncovered metal film. Chromium is remarkable for its magnetic properties: it is the only elemental solid which shows antiferromagnetic ordering at room temperature and below. Above 38° C., chromium transforms into a paramagnetic state.

The magnetic pads 124 prevent the PCB plating process from creating via barrel stubs, thus eliminating the need for post-processing steps, such as mechanical drilling and chemical etching to improve cost and reliability of boards.

In accordance with features of the invention, the PCB plating process optionally is performed using a generally conventional plating process. Conventional PCB finishing processes are performed while eliminating the need to backdrill each via after the plating process by the use of magnetic pads 124.

U.S. Pat. No. 8,262,894 to Xu et al. issued Sep. 11, 2012 discloses a method of changing a copper concentration in an electroplating bath, comprising: placing a substrate in a copper electroplating bath comprising an acidic, aqueous solution exhibiting a copper ion concentration; disposing a copper salt in solid form within a container located in the copper electroplating bath, a chamber of the container being in fluid communication with an the aqueous solution of the copper electroplating bath; dissolving at least some of the copper salt in solid form to raise the copper ion concentration in the aqueous solution and maintain the copper ion concentration in the aqueous solution at about saturation to achieve high copper ion concentrations for accommodating high speed plating; and electroplating copper on the substrate using a copper containing anode.

In accordance with features of the invention, a high speed aqueous seed and plate processing in the PCB manufacture can be used, such as disclosed in the above-identified U.S. Pat. No. 8,262,894.

Referring to FIGS. 2A and 2B, there is shown example structures generally designated by respective reference character 200, 230 for manufacturing a printed circuit board (PCB) with enhanced via creation in accordance with the preferred embodiment.

Structures 200, 230 include a printed circuit board (PCB) 202 including a plurality of layers 212, 214, 216, 218, 220, 222, and 228, as shown. PCB includes a magnetic pad 224 rendered within a via 226. PCB 102 includes, for example, a plurality of insulator layers 212, 216, 220, 228 with a plurality of conductive layers 214, 218, 222. Structure 200 includes the magnetic pad 224 rendered within via 226 and the PCB 202 before aqueous seed and plate processing in the PCB manufacture. Magnetic pad 224 advantageously eliminates via barrel stub creation during PCB plating processes during PCB manufacturing.

The magnetic pad 224 in structures 200, 230 holds a magnetic anti-pad holding ferrous resist material. The magnetic pad ferrous resist material prohibits a seed layer from forming in the via barrel outside the intended area of the magnetic anti-pad 224. A PCB aqueous seed and plate processing includes the plating process rendering copper 234 substantially only in the region outside an intended area of the magnetic anti-pad as shown in FIG. 2B.

Figure 3:
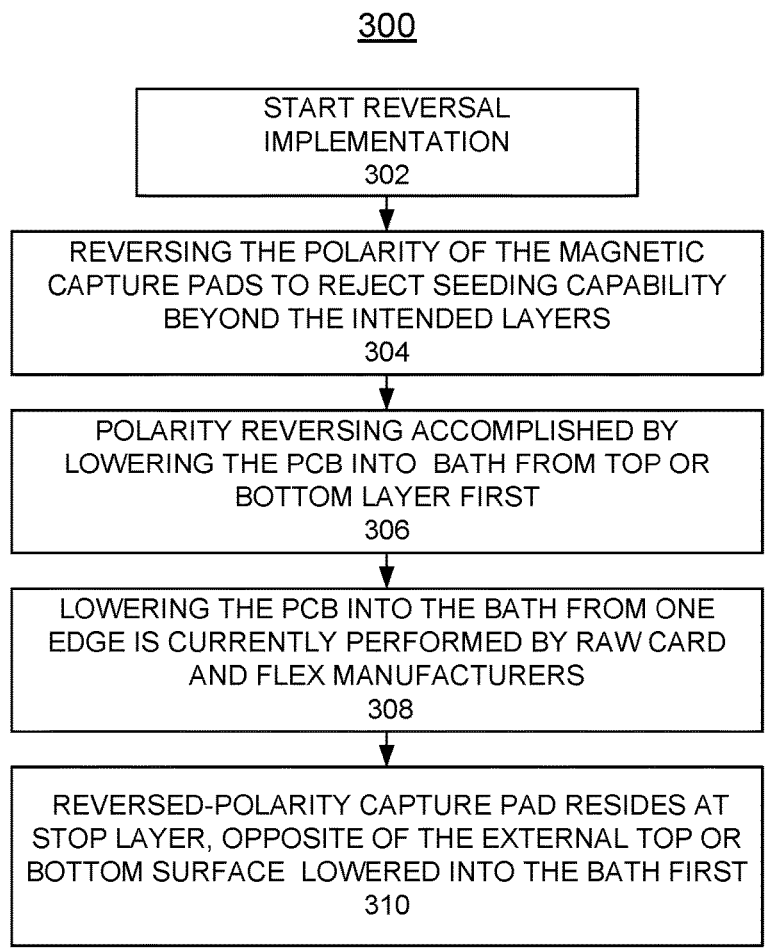
FIG. 3 is a flow chart illustrating other example steps for implementing enhanced via creation in accordance with a preferred embodiment.

Referring now to FIG. 3, there is shown a flow chart illustrating example steps generally designated by reference character 300 for reversal implementation of structures 100, 200 in accordance with the preferred embodiment starting at a reversal implementation block 302. Doing so rejects either the ferrous material for structure 100 or the seeding material for structure 200, instead of containing such materials. The end result is the same, yet reversal allows for manufacturing options.

The reversal implementations are carried out by: as indicated at a block 304, reversing the polarity of the magnetic capture pads to reject seeding capability beyond the intended layers.

As indicated at a block 306, polarity reversing is accomplished by lowering the PCB into the bath from a top layer or a bottom layer first.

As indicated at a block 308, lowering the PCB into the bath from one edge is something which is performed by raw card and flex manufacturers today.

As indicated at a block 310, the reversed-polarity capture pad resides at the stop layer, opposite of the external surface which is being lowered into the bath first.

In accordance with features of the invention, the alternative method for via creation eliminates creation of the via barrel stub. Since the via barrel stub is not created, the need for post-processing steps, such as mechanical drilling and chemical etching, are eliminated, reducing PCB cost and maximizing interface margin.

While the present invention has been described with reference to the details of the embodiments of the invention shown in the drawing, these details are not intended to limit the scope of the invention as claimed in the appended claims.

What is claimed is:

1. A method for implementing enhanced customized printed circuit board (PCB) via creation during printed circuit board (PCB) manufacturing comprising: providing a printed circuit board (PCB); forming a via extending through the printed circuit board (PCB); rendering at least one magnetic pad into the via before aqueous seed and plate processing in the PCB manufacture; performing PCB aqueous seed and plate processing, and said at least one magnetic pad selectively rendering copper in at least one selected region of the via.

2. The method as recited in claim 1 wherein rendering said at least one magnetic pad includes rendering said at least one magnetic pad by an inner-layer PCB processing step.

3. The method as recited in claim 2 includes accomplishing said at least one magnetic pad rendering using an existing PCB manufacturing method.

4. The method as recited in claim 1 wherein rendering said at least one magnetic pad includes forming at least one magnetic capture pad.

5. The method as recited in claim 4 includes forming said at least one magnetic capture pad with ferrous seed material.

6. The method as recited in claim 5 wherein rendering said at least one magnetic pad includes providing said ferrous seed material for prohibiting a seed layer from forming in a via barrel outside of an intended area with the seed material being captive by aqueous magnetic material with said at least one magnetic pad.

7. The method as recited in claim 1 wherein rendering said at least one magnetic pad includes forming at least one magnetic anti-pad.

8. The method as recited in claim 7 includes forming said at least one magnetic anti-pad with ferrous resist material.

9. The method as recited in claim 1 wherein said at least one magnetic pad includes at least one magnetic capture pad, and performing said PCB aqueous seed and plate processing includes said plate processing rendering copper substantially only in the region captive by said at least one magnetic capture pad.

10. The method as recited in claim 1 includes said PCB aqueous seed and plate processing including said plate processing rendering copper substantially only in the region outside an intended area of a magnetic anti-pad.

11. The method as recited in claim 1 wherein said at least one magnetic pad includes magnetic capture pads and further includes reversing a polarity of the magnetic capture pads whereby said magnetic capture pads reject seeding capability beyond an intended layer.

12. The method as recited in claim 11 includes lowering the PCB into a bath from one edge and whereby said magnetic capture pads reside at a stop layer, opposite an external surface lowered into the bath first.

13. The method as recited in claim 1 includes performing conventional PCB finishing processes.

* * * * *